(12) United States Patent
Kim et al.

(10) Patent No.: US 12,204,404 B2
(45) Date of Patent: Jan. 21, 2025

(54) ELECTRONIC DEVICE HAVING ECC DECODER

(71) Applicant: SK hynix Inc., Gyeonggi-do (KR)

(72) Inventors: Dae Sung Kim, Gyeonggi-do (KR); Soon Young Kang, Gyeonggi-do (KR); Sang Ho Yun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/467,731

(22) Filed: Sep. 15, 2023

(65) Prior Publication Data
US 2024/0202068 A1    Jun. 20, 2024

(30) Foreign Application Priority Data

Dec. 19, 2022  (KR) .......................... 10-2022-0178001

(51) Int. Cl.
  *H03M 13/00*   (2006.01)
  *G06F 11/10*   (2006.01)
  *H03M 13/15*   (2006.01)
(52) U.S. Cl.
  CPC ..... *G06F 11/1044* (2013.01); *H03M 13/1575* (2013.01)
(58) Field of Classification Search
  CPC ............. H03M 13/1515; H03M 13/45; H03M 13/1108; G06F 11/1044
  See application file for complete search history.

(56) References Cited

U.S. PATENT DOCUMENTS

| | | | | |
|---|---|---|---|---|
| 9,768,807 | B2* | 9/2017 | Zhang | G06F 11/1068 |
| 9,792,176 | B2* | 10/2017 | Blaichman | G11C 29/52 |
| 10,043,582 | B2* | 8/2018 | Alhussien | G11C 7/1006 |
| 10,158,380 | B2* | 12/2018 | Sharon | H03M 13/6325 |
| 10,469,103 | B1* | 11/2019 | Jeong | H03M 13/1108 |
| 11,115,055 | B2* | 9/2021 | Doubchak | H03M 13/2948 |
| 11,184,026 | B2* | 11/2021 | Berman | G06F 11/1012 |
| 11,689,216 | B1* | 6/2023 | Shapiro | H03M 13/2906 |
| | | | | 714/758 |
| 11,742,879 | B2* | 8/2023 | Doubchak | H03M 13/1108 |
| | | | | 714/764 |
| 11,870,459 | B2* | 1/2024 | Solomon | H03M 13/1148 |

FOREIGN PATENT DOCUMENTS

KR   10-2125371 B1   6/2020

* cited by examiner

*Primary Examiner* — Esaw T Abraham
(74) *Attorney, Agent, or Firm* — IP & T GROUP LLP (57) ABSTRACT

The present technology provides a controller for controlling a memory device comprising: a hard syndrome calculator configured to generate a hard syndrome of a hard data chunk received from the memory device; a delta syndrome calculator configured to generate a delta syndrome of a delta bit data received from the memory device, the delta bit data indicating a reliability of the hard data chunk; a soft syndrome generator configured to generate a soft syndrome of the hard syndrome and the delta syndrome; a data determinator configured to select, as hard decision data, one of the hard data chunk and a soft data chunk, the selected data chunk corresponding to a syndrome having a lowest syndrome weight; and an error corrector configured to perform an ECC decoding operation on the hard decision data.

22 Claims, 10 Drawing Sheets

$$\begin{matrix} \text{H Matrix} & & \text{C} & & \text{SYNDROME} & & \\ \begin{bmatrix} 1 & 0 & 0 & 1 & 1 & 1 & 0 & 0 & 0 & 0 \\ 1 & 1 & 1 & 0 & 0 & 1 & 1 & 0 & 0 & 0 \\ 0 & 0 & 1 & 1 & 1 & 0 & 1 & 1 & 0 & 0 \\ 1 & 1 & 0 & 0 & 1 & 0 & 0 & 1 & 1 & 0 \\ 0 & 1 & 1 & 1 & 0 & 0 & 0 & 0 & 1 & 1 \end{bmatrix} & \times & \begin{bmatrix} r0 \\ r1 \\ r2 \\ r3 \\ \vdots \\ r8 \\ r9 \end{bmatrix} & = & \begin{bmatrix} r0 \oplus r3 \oplus r4 \oplus r5 \\ r0 \oplus r1 \oplus r2 \oplus r5 \oplus r6 \\ r2 \oplus r3 \oplus r4 \oplus r6 \oplus r7 \\ r0 \oplus r1 \oplus r4 \oplus r7 \oplus r8 \\ r1 \oplus r2 \oplus r3 \oplus r8 \oplus r9 \end{bmatrix} & = & \begin{bmatrix} p0 \\ p1 \\ p2 \\ p3 \\ p4 \end{bmatrix} \end{matrix}$$

Parity Check Bit

FIG. 7

Parity Check Bit
$$\begin{bmatrix} p0 \\ p1 \\ p2 \\ p3 \\ p4 \end{bmatrix} \Longrightarrow$$

SYNDROME WEIGHT $$PSUM = \sum_{i=0}^{4} pi$$

ELECTRONIC DEVICE HAVING ECC DECODER

CROSS-REFERENCE TO RELATED APPLICATION

This application claims priority under 35 U. S. C. § 119 to Korean Patent Application No. 10-2022-0178001 filed on Dec. 19, 2022, which is incorporated herein by reference in its entirety.

BACKGROUND

1. Field

Various embodiments of the present disclosure relate to an electronic device including an error correction code (ECC) decoder and, particularly, a memory controller and a memory system for increasing a success probability of an ECC decoding operation and for setting an optimal ECC decoding environment.

2. Discussion of the Related Art

As data is programmed into the memory cell arrays, a cell distribution is formed. When a read operation is performed using a read voltage corresponding to a shape of a cell distribution, a reliable data chunk can be obtained.

However, the cell distribution is degraded when the operation of the nonvolatile memory is performed continuously. In this case, when the read operation is performed with a previously preset read voltage, the probability of obtaining a data chunk including a large number of errors increases.

The controller controlling the memory cell arrays may include an ECC decoder to improve the reliability of the data chunks. The ECC decoder can correct errors in the data chunk by performing decoding operations according to a predefined ECC algorithm.

SUMMARY

Various embodiments of the present disclosure are directed to a controller with improved access operation speed.

Technical tasks to be achieved in the present disclosure are not limited to the aforementioned technical tasks and other unmentioned technical tasks will be clearly understood by those skilled in the art from the following description.

Various embodiments of the present disclosure are directed to providing a memory device, a memory system, a controller included in the memory system, and a data processing system including the memory system.

In an embodiment of the present disclosure, a controller for controlling a memory device comprises: a hard syndrome calculator configured to generate a hard syndrome by performing a syndrome operation on a hard data chunk received from the memory device; a delta syndrome calculator configured to generate a delta syndrome by performing a syndrome operation on a delta bit data received from the memory device, the delta bit data indicating a reliability of the hard data chunk; a soft syndrome generator configured to generate a soft syndrome by performing a logic operation on the hard syndrome and the delta syndrome; a data determinator configured to select, as hard decision data, one of the hard data chunk and a soft data chunk, the selected data chunk corresponding to a syndrome having a lowest syndrome weight among the hard syndrome and the soft syndrome; and an error corrector configured to perform an ECC decoding operation on the hard decision data.

The data determinator includes a soft data chunk restorer configured to restore the soft data chunk corresponding to the soft syndrome when the soft syndrome has a less syndrome weight than the hard syndrome.

The data determinator selects the soft data chunk as the hard decision data when the soft syndrome has the less syndrome weight than the hard syndrome.

In an embodiment of the present disclosure, memory system comprises: a controller; and a memory device including a memory cell array and configured to generate a delta bit data by performing a logic operation on a hard data chunk and a soft data chunk, the hard data chunk being read by a hard decision read voltage from a specific region of the memory cell array, the soft data chunk being read by a soft decision read voltage from the specific region, the soft decision read voltage being different from the hard decision read voltage by a preset offset, and provide the controller with the hard data chunk and the delta bit data other than the soft decision read voltage; and wherein the controller includes: a soft syndrome generator configured to generate a soft syndrome by performing a logic operation on a hard syndrome for the hard data chunk and a delta syndrome for the delta bit data; and a data determiner configured to determine whether to restore the soft data chunk based on a result of comparing a syndrome weight of the hard syndrome with a syndrome weight of the soft syndrome.

The data determinator restores the soft data chunk when the soft syndrome has a less syndrome weight than the hard syndrome.

The controller further comprises an error corrector configured to perform an ECC decoding operation on the restored soft data chunk as the hard decision data.

Aspects of the present disclosure are merely some embodiments of the present disclosure. Various embodiments into which technical characteristics of the present disclosure have been incorporated may be derived and understood based on the detailed description of the present disclosure by a person having ordinary knowledge in the art.

In accordance with an embodiment of the present disclosure, the controller and the memory system can increase the probability of success of ECC decoding by performing ECC decoding on a data chunk having a low error rate among a plurality of data chunks.

Moreover, in accordance with an embodiment of the present disclosure, the controller and the memory system can set an optimal ECC decoding environment by using the read voltage of the data chunk having a low error rate in the next read operation.

The controller and the memory system according to embodiments of the present disclosure can increase the probability of success of ECC decoding and set an optimal ECC decoding environment.

The controller and the memory system according to embodiments of the present disclosure can reduce the resources used for ECC decoding.

Effects of the present disclosure which may be obtained in the present disclosure are not limited to the aforementioned effects, and other effects not described above may be evidently understood by a person having ordinary knowledge in the art to which the present disclosure pertains from the following description.

DETAILED DESCRIPTION

Hereinafter, various embodiments of the present disclosure will be described in detail with reference to the accompanying drawings. In the following description, it is to be noted that only a part necessary to understand an operation according to an embodiment of the present disclosure is described and descriptions of the other parts will be omitted in order not to obscure the subject matter of the present disclosure.

In the following, embodiments of the present invention will be described with reference to the accompanying drawings in order to describe the technical ideas of the present invention in sufficient detail to enable one having ordinary skill in the technical field to which the present invention belongs to practice it with ease.

Figure 1:
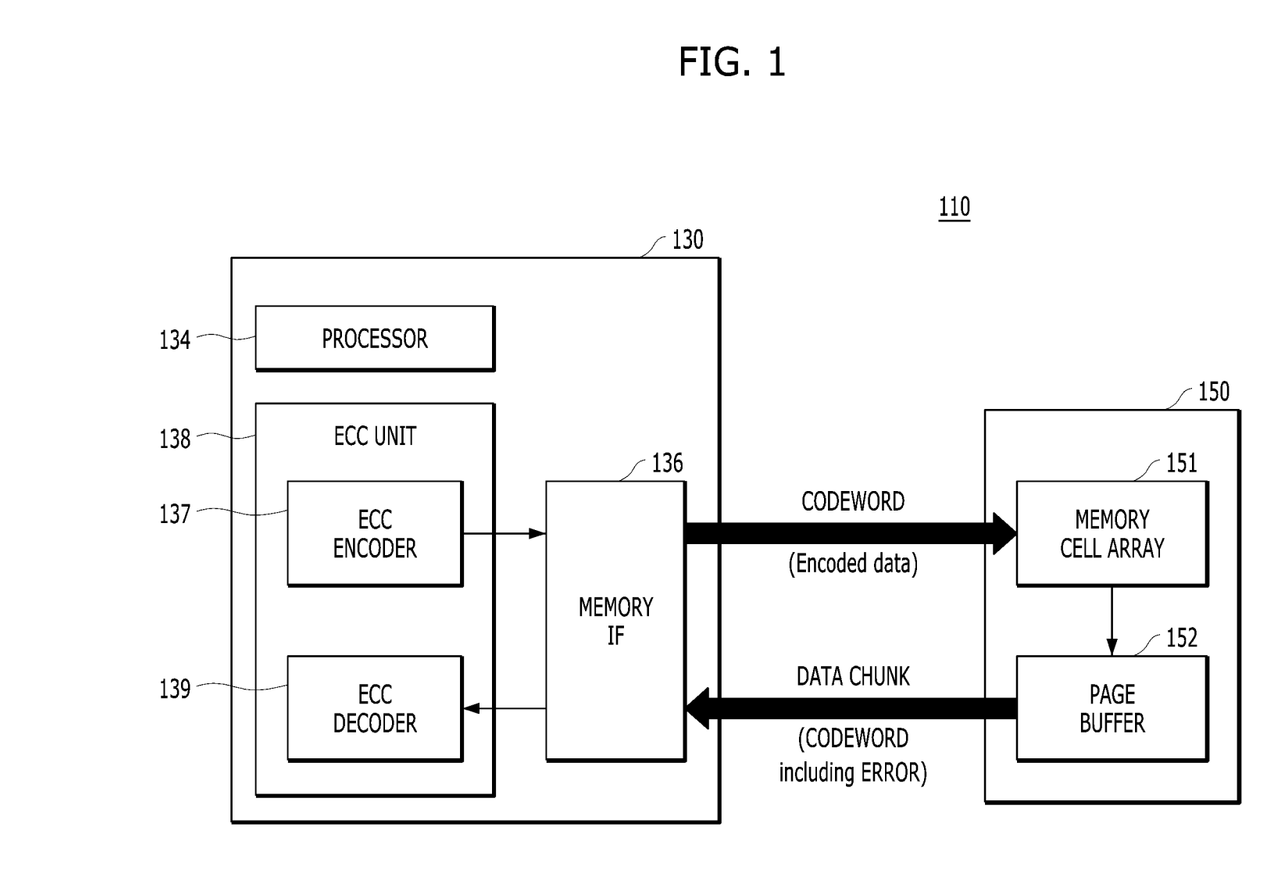
FIG. 1 is a block diagram illustrating a memory system according to an embodiment of the present disclosure.

FIG. 1 is a block diagram illustrating a memory system 110 according to an embodiment of the present disclosure.

Referring to FIG. 1, the memory system 110 may include a controller 130 and a memory device 150.

The controller 130 may include a processor 134, an error correction code (ECC) unit 138, and a memory interface 136.

The processor 134 may control various operations of the memory system 110. The processor 134 may control a write operation of the memory device 150 to store data in the memory device 150 in response to a write request transmitted from the external device (e.g., a host). The processor 134 may control a read operation of the memory device 150 in response to a read request transmitted from the external device to read data stored in the memory device 150 and transmit the data to the external device.

The ECC unit 138 may include an ECC encoder 137 and an ECC decoder 139.

The ECC encoder 137 may generate a codeword by encoding data to be stored in the memory device 150 based on, for example, a low-density parity check (LDPC) code.

The ECC decoder 139 may perform an ECC decoding operation on a data chunk read from the memory device 150. In the present disclosure, the data chunk may be the codeword and may include an error.

The ECC decoder 139 may calculate a syndrome corresponding to the data chunk based on the parity check matrix corresponding to a low-density parity check (LDPC) code and may determine whether the data chunk includes the error based on the calculated syndrome. Then, if the ECC decoder 139 can correct the error included in the data chunk, the ECC decoder 139 can correct the error and output the error corrected data. If the ECC decoder 139 cannot correct the error included in the data chunk, the ECC decoder 139 may report to the processor 134 that the ECC decoding operation has failed. The ECC decoding operation may be more likely to fail as the number of errors in the data chunk increases.

The memory interface 136 is connected to the memory device 150 to input/output data. The memory interface 136 may transmit the codeword generated by the ECC encoder 137 to the memory device 150 and receive various data, including the data chunk, from the memory device 150.

Under the control of the controller 130, the memory device 150 may perform the write operation on the codeword transmitted from the controller 130 and may perform the read operation to transmit the data chunk to the controller 130.

For this purpose, the memory device 150 may include a memory cell array 151 having a plurality of memory cells and a page buffer 152. The memory cell array 151 may store the codeword. The page buffer 152 may store the data chunk read from the memory cell array 151.

Figure 2A:
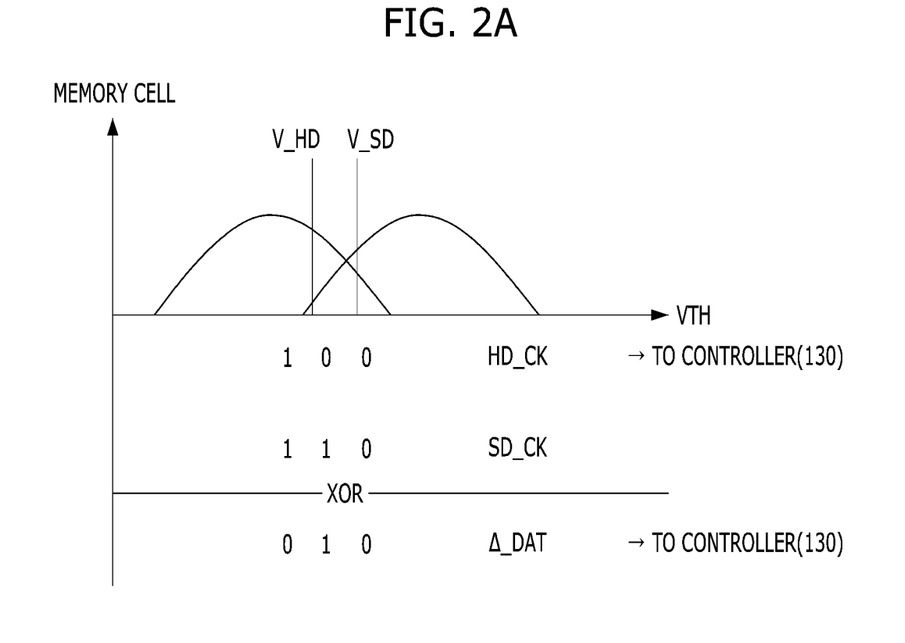
FIGS. 2A and 2B are a block diagram illustrating a memory device according to an embodiment of the present disclosure.
Figure 2B:
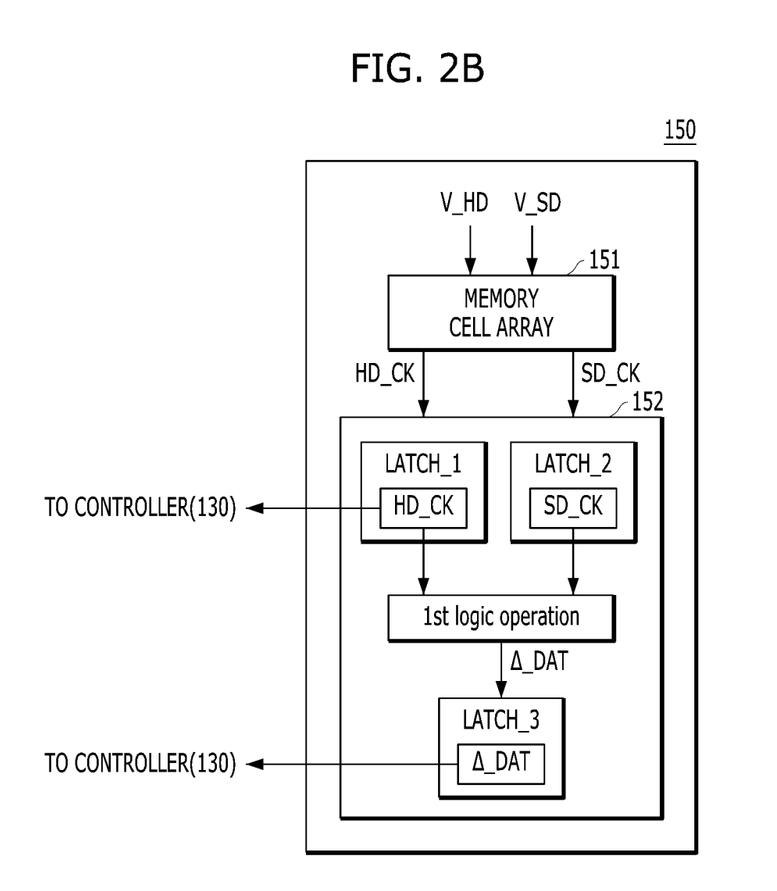

FIGS. 2A and 2B are a block diagram illustrating a memory device according to an embodiment of the present disclosure.

Specifically, FIG. 2A illustrates an example of a hard data chunk HD_CK and a soft data chunk SD_CK read by the memory device 150 and a delta bit data Δ_DAT generated by the memory device 150. FIG. 2B illustrates an example of the memory device 150 of the present disclosure.

The data stored in a specific region of the memory device 150 may be read by determining a threshold voltage VTH of the memory cells through a read voltage. Specifically, when the read voltage is supplied to word lines of the memory cells corresponding to the specific region, data '1' may be read from the memory cells having a threshold voltage lower than the read voltage, and data '0' may be read from the memory cells having a threshold voltage higher than the read voltage.

The memory device 150 may read the data chunk by applying a hard decision read voltage V_HD for the hard decision and a soft decision read voltage V_SD for the soft decision to the specific region.

The soft decision read voltage V_SD may differ from the hard decision read voltage V_HD by a preset offset. The hard decision read voltage V_HD is a coarse read voltage, and the soft decision read voltage V_SD may be a fine read voltage.

Figure 5A:
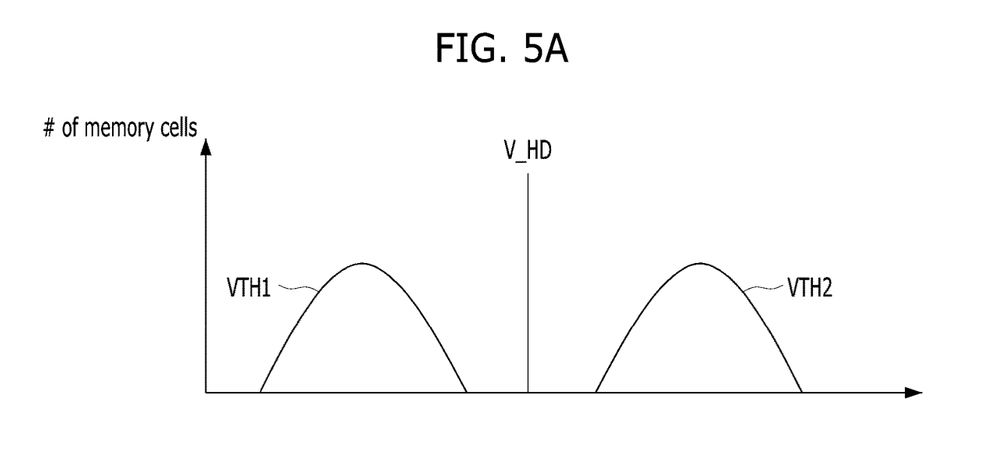
FIGS. 5A through 5C are a block diagram illustrating a hard decision read operation and a soft decision read operation according to an embodiment of the present disclosure.
Figure 5B:
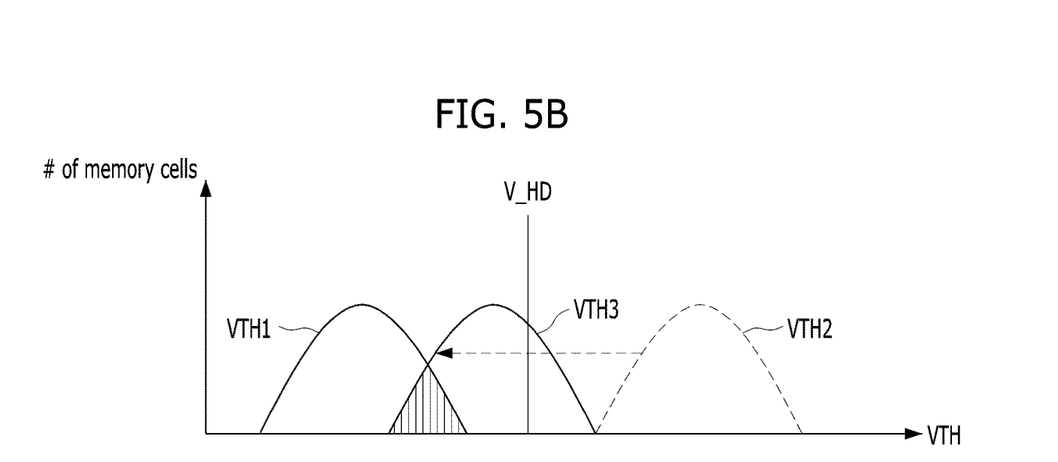
Figure 5C:
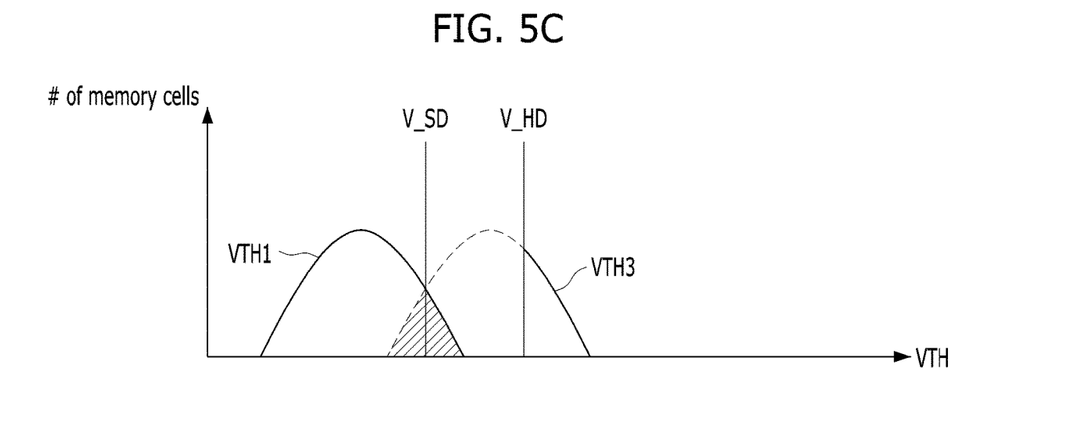

The hard decision read operation and the hard decision read operation of the memory device 150 are described in detail in FIGS. 5A to 5C.

As shown in FIG. 2A, the memory device 150 may determine the data chunk '100' read by the hard decision read voltage V_HD as the hard data chunk HD_CK. The memory device 150 may determine the data chunk '110' read by the soft decision read voltage V_SD as the soft data chunk SD_CK.

The memory device 150 may perform a first logic operation on the hard data chunk HD_CK and the soft data chunk SD_CK to generate the delta bit data Δ_DAT. The delta bit data Δ_DAT may indicate a reliability of the hard data chunk HD_CK determined based on the soft data chunk SD_CK. The first logic operation may include the exclusive OR (XOR) operation.

The delta bit data Δ_DAT may indicate whether each of the bits comprising the hard data chunk HD_CK is identical to a corresponding bit included in the soft data chunk SD_CK. For example, a bit '1' in the delta bit data Δ_DAT may indicate that corresponding bits respectively within the hard data chunk HD_CK and the soft data chunk SD_CK are different. The bit '0' included in the delta bit data Δ_DAT may indicate that corresponding bits respectively within the hard data chunk HD_CK and the soft data chunk SD_CK are identical. Therefore, the bits of the hard data chunk HD_CK corresponding to the bit '0' included in the delta bit data Δ_DAT may be highly reliable. Also, the bits of the hard data chunk HD_CK corresponding to the bit '1' included in the delta bit data Δ_DAT may be less reliable.

In addition, the delta bit data Δ_DAT may include location information of a bit within the hard data chunk HD_CK, which is different from a corresponding bit included in the soft data chunk SD_CK. For example, if the hard data chunk HD_CK is '10000000' and the soft data chunk SD_CK is '11000000', a value of the 7th bit of the hard data chunk HD_CK is different from a value of the 7th bit of the soft data chunk SD_CK. Accordingly, the delta bit data Δ_DAT may include '111', which is the location information for the 7th bit.

The memory device 150 of the present disclosure may transmit the hard data chunk HD_CK to the controller 130, which performs the ECC decoding operation. The memory device 150 may transmit the delta bit data Δ_DAT to the controller 130 instead of the soft data chunk SD_CK.

At this time, the memory device 150 may compress the delta bit data Δ_DAT and provide it to the controller 130. Since the compressed delta bit data Δ_DAT has a smaller size than the soft data chunk SD_CK, the memory device 150 of the present disclosure may provide an effect of preventing a read delay due to the transmission time of the data chunk.

Referring to FIG. 2B, the memory device 150 may include a memory cell array 151 and a page buffer 152.

When the hard decision read voltage V_HD and the soft decision read voltage V_SD are applied to the memory cell array 151, the memory cell array 151 may be output to the page buffer 152.

The page buffer 152 may include at least one or more latches LATCH_1, LATCH_2, LATCH_3 for storing the data chunk read from the memory cell array 151. The first latch LATCH_1 may store the hard data chunk HD_CK, the second latch LATCH_2 may store the soft data chunk SD_CK, and the third latch LATCH_3 may store the delta bit data Δ_DAT.

Further, the page buffer 152 may include a first logic operator to generate the delta bit data Δ_DAT using the hard data chunk HD_CK and the soft data chunk SD_CK. The first logic operator of the present disclosure may include an XOR operator.

The memory device 150 may transmit the hard data chunk HD_CK stored in the first latch LATCH_1 and the delta bit data Δ_DAT stored in the third latch LATCH_3 to the controller 130.

Figure 3:
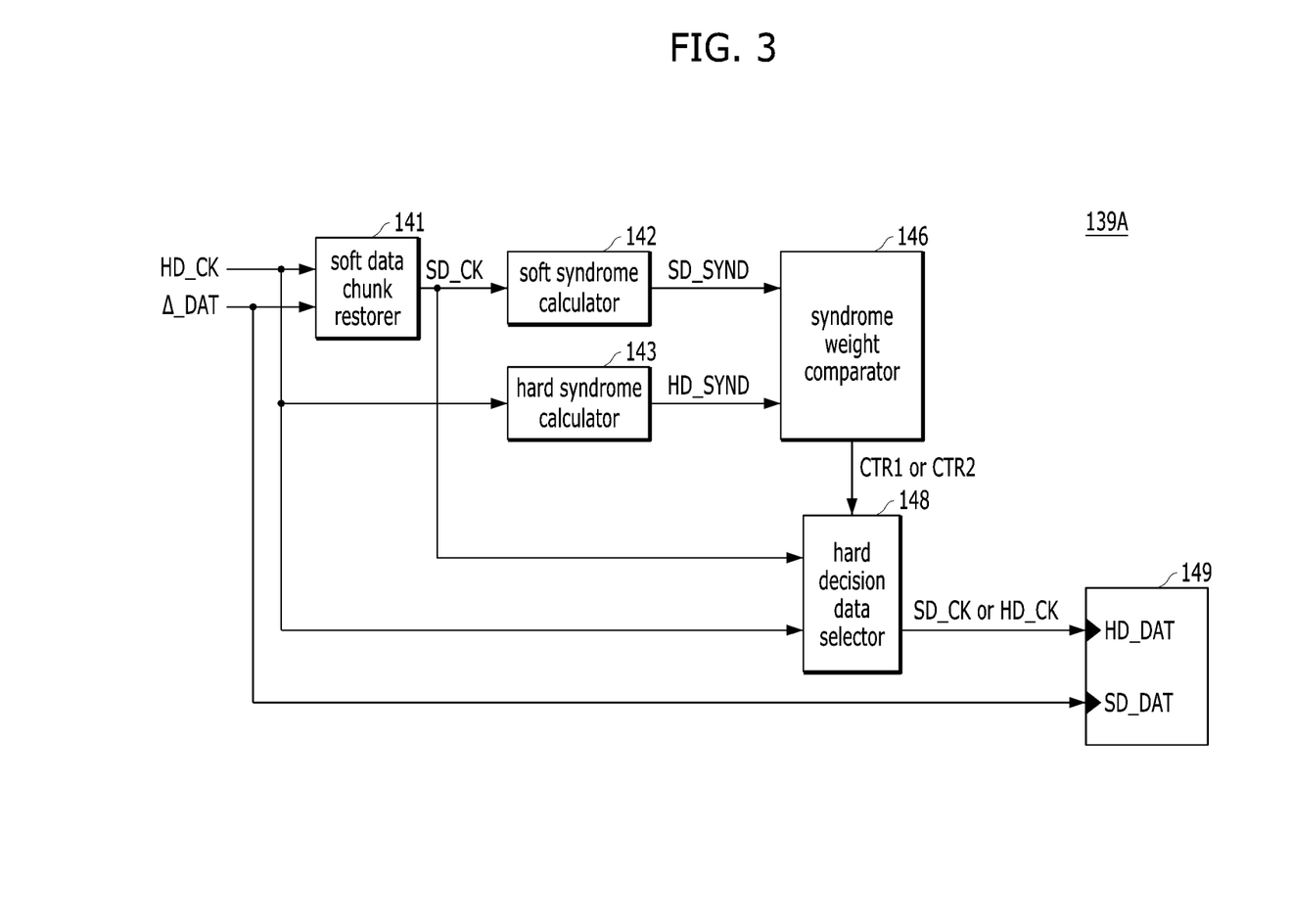
FIG. 3 is a block diagram illustrating an example of an ECC decoder according to a first embodiment of the present disclosure.

FIG. 3 is a block diagram illustrating an example of an ECC decoder according to a first embodiment of the present disclosure.

Hereinafter, an operation of an ECC decoder 139A according to a first embodiment of the present disclosure is described with reference to FIGS. 1 and 3.

The ECC decoder 139A according to a first embodiment of the present disclosure may include a soft data chunk restorer 141, a soft syndrome calculator 142, a hard syndrome calculator 143, a syndrome weight comparator 146, a hard decision data selector 148, and an error corrector 149.

The soft data chunk restorer 141 may perform a second logic operation on the hard data chunk HD_CK and the delta bit data Δ_DAT received from the memory device 150 to restore the soft data chunk SD_CK not received from the memory device 150.

The second logic operation performed by the soft data chunk restorer 141 may be the same logic operation (e.g., XOR) as the first logic operation performed by the memory device 150 to generate the delta bit data Δ_DAT. If the delta bit data Δ_DAT was generated by the XOR operation of the hard data chunk HD_CK and the soft data chunk SD_CK, the soft data chunk SD_CK may also be restored by the XOR operation of the hard data chunk HD_CK and the delta bit data Δ_DAT.

At this time, if the size of the hard data chunk HD_CK and the delta bit data Δ_DAT is 100 bits, the soft data chunk restorer 141 may restore the soft data chunk SD_CK of 100 bits by the XOR operation of the 100-bit data.

The soft syndrome calculator 142 may perform the syndrome operation on the restored soft data chunk SD_CK to calculate the soft syndrome SD_SYND.

The hard syndrome calculator 143 may perform the syndrome operation on the hard data chunk HD_CK to calculate the hard syndrome HD_SYND.

In this case, the size of the soft syndrome SD_SYND and the hard syndrome HD_SYND may be smaller than the size of the hard data chunk HD_CK and the soft data chunk SD_CK. The operation of the syndrome calculator 139A_2 to generate the syndrome of the data chunk will be described in detail in FIG. 6.

The ECC decoder 139A according to the first embodiment of the present disclosure performs the restoration operation once and the syndrome calculation operation once to calculate the soft syndrome SD_SYND of the soft data chunk SD_CK not received from the memory device 150. The restoration operation includes performing the first logic operation on the hard data chunk HD_CK and the delta bit data Δ_DAT to restore the soft data chunk SD_CK. The syndrome calculation operation includes calculating the soft syndrome SD_SYND for the soft data chunk SD_CK. Since the data size of the data chunk is larger than the data size of the syndrome, the resources consumed by the first logic operation are larger than the resources consumed by the syndrome calculation.

Using the calculated hard syndrome HD_SYND and the calculated soft syndrome SD_SYND, the syndrome weight comparator 146 may determine the error rate of each of the hard data chunk HD_CK and the restored soft data chunk SD_CK. In the present disclosure, the error rate of the data chunk may refer to the ratio of the error bits among the total bits of the data chunk. Therefore, in the description of the present disclosure, the error rate of the data chunk may be used as having the same meaning as the number of the error bits included in the data chunk and the syndrome weight of the syndrome corresponding to the data chunk.

To determine the error rates of the hard data chunk HD_CK and the restored soft data chunk SD_CK, the syndrome weight comparator 146 calculates the syndrome weight of the hard syndrome HD_SYND and the soft syndrome SD_SYND. The syndrome weight of the hard syndrome HD_SYND may indicate the error rate of the hard data chunk HD_CK, and the syndrome weight of the soft syndrome SD_SYND may indicate the error rate of the restored soft data chunk SD_CK.

Figure 7:
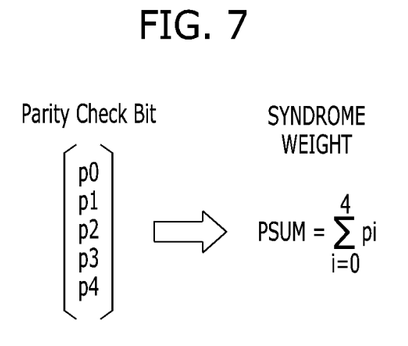
FIG. 7 is a block diagram describing a syndrome weight calculation operation according to an embodiment of the present disclosure.

The operation of the syndrome weight comparator 146 for calculating the syndrome weight is described in more detail in FIG. 7.

The syndrome weight comparator 146 compares the syndrome weights of the hard syndrome HD_SYND and the soft syndrome SD_SYND to determine the syndrome having the less syndrome weight. Namely, the syndrome weight comparator 146 may compare the syndrome weights of the hard syndrome HD_SYND and the soft syndrome SD_SYND to determine the data chunk having the lowest error rate among the hard data chunk HD_CK and the restored soft data chunk SD_CK.

If the syndrome weight of the soft syndrome SD_SYND is less than the syndrome weight of the hard syndrome HD_SYND, the syndrome weight comparator 146 may generate the first control signal CTR1. If the syndrome weight of the soft syndrome SD_SYND is greater than the syndrome weight of the hard syndrome HD_SYND, the syndrome weight comparator 146 may generate the second control signal CTR2.

In response to the first or second control signal CTR1 or CTR2, the hard decision data selector 148 may output one of the hard data chunk HD_CK received from the memory device 150 and the soft data chunk SD_CK restored by the soft data chunk restorer 141, to the error corrector 149.

Accordingly, the hard decision data selector 148 may output the restored soft data chunk SD_CK to the error corrector 149 in response to the first control signal CTR1. Further, the hard decision data selector 148 may output the hard data chunk HD_CK to the error corrector 149 in response to the second control signal CTR2.

The error corrector 149 may perform an ECC decoding operation using either the hard data chunk HD_CK and the soft data chunk restorer 141 output from the hard decision data selector 148 as the hard decision data HD_DAT.

The error corrector 149 may repeat the ECC decoding operation on the delta bit data $\Delta$_DAT, as the soft decision data SD_DAT and received from the memory device 150 if the ECC decoding operation on the hard decision data HD_DAT fails.

Figure 4:
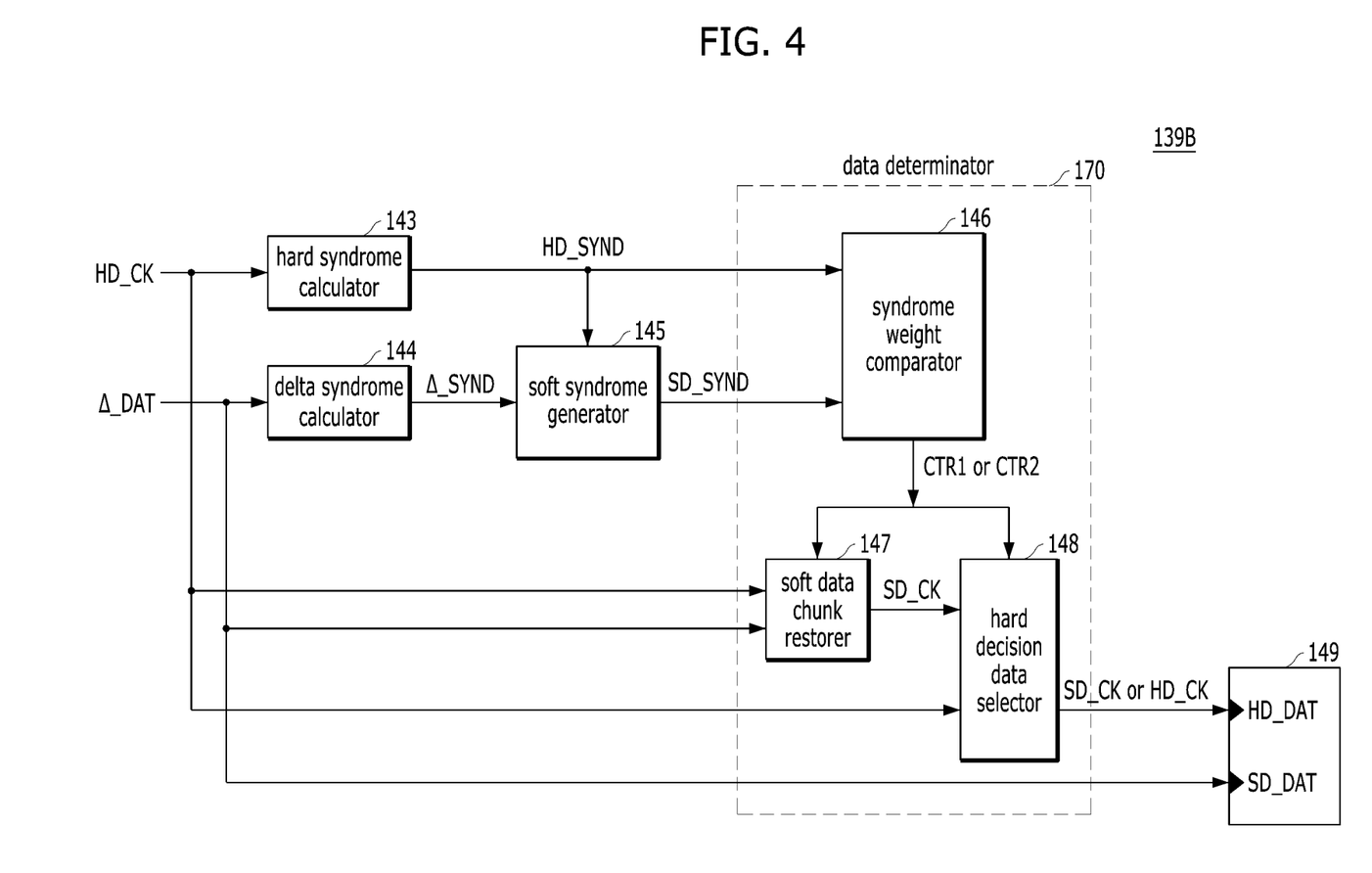
FIG. 4 is a block diagram illustrating an example of an ECC decoder according to a second embodiment of the present disclosure.

FIG. 4 is a block diagram illustrating an example of an ECC decoder according to a second embodiment of the present disclosure.

Hereinafter, with reference to FIGS. 1 and 4, the operation of the ECC decoder 139B according to a second embodiment of the present disclosure is described.

The ECC decoder 139B according to a second embodiment of the present disclosure may include a hard syndrome calculator 143, a delta syndrome calculator 144, a soft syndrome generator 145, a data determinator 170, and an error corrector 149.

The hard syndrome calculator 143 may perform the syndrome operation on the hard data chunk HD_CK received through the memory interface 136 from the memory device 150 to calculate the hard syndrome HD_SYND. The delta syndrome calculator 144 may perform the syndrome operation on the delta bit data $\Delta$_DAT received through the memory interface 136 from the memory device 150 to calculate the delta syndrome $\Delta$_SYND. The method of generating the syndrome of the data chunk is described in detail in FIG. 6.

The soft syndrome generator 145 may perform a third logic operation on the hard syndrome HD_SYND and the delta syndrome $\Delta$_SYND to generate the soft syndrome SD_SYND. The soft syndrome SD_SYND may be the syndrome of the soft data chunk SD_CK not received from the memory device 150. The third logic operation may be the same as the first logic operation performed by the memory device 150 to generate the delta bit data $\Delta$_DAT, that is, the third logic operation may include the XOR operation.

The ECC decoder 139B according to the second embodiment of the present disclosure may generate the soft syndrome SD_SYND even if it does not restore the soft data chunk SD_CK.

The data determinator 170 may use the soft syndrome SD_SYND generated by the soft syndrome generator 145 to calculate the error rate of the soft data chunk SD_CK. The data determinator 170 may calculate the error rate of the soft data chunk SD_CK even if the soft data chunk SD_CK is not restored.

Further, the data determinator 170 may restore the soft data chunk SD_CK not received from the memory device 150 only when the error rate of the soft data chunk SD_CK is less than the error rate of the hard data chunk HD_CK, and determine the restored soft data chunk SD_CK as the hard decision data HD_DAT.

Further, the data determinator 170 may determine the hard data chunk HD_CK as the hard decision data HD_DAT when the error rate of the soft data chunk SD_CK is greater than the error rate of the hard data chunk HD_CK.

The ECC decoder 139B according to the second embodiment of the present disclosure performs syndrome calculation operations twice and the syndrome generation operation once to calculate the soft syndrome SD_SYND of the soft data chunk SD_CK not received from the memory device 150. The syndrome calculation operations performed twice may include a syndrome calculation operation of the hard syndrome HD_SYND for the hard data chunk HD_CK and a syndrome calculation operation of the delta syndrome $\Delta$_SYND for the delta bit data $\Delta$_DAT. The syndrome generation operation performed once may include a syndrome generation operation of a soft syndrome SD_SYND by performing a third logic operation on the hard syndrome HD_SYND and the delta syndrome $\Delta$_SYND.

Since the data size of the syndrome is smaller than the data size of the data chunk, the resources consumed by the syndrome calculation operations performed twice and the syndrome generation operation performed once according to the second embodiment are less than a sum of the resources consumed by the data chunk restoration operation performed once and the syndrome calculation operation performed once according to the first embodiment.

Thus, the ECC decoder 139B according to the second embodiment of the present disclosure can simply generate the soft syndrome SD_SYND by performing the third logic operation to the hard syndrome HD_SYND and the delta syndrome $\Delta$_SYND having a data size smaller than the soft data chunk SD_CK. Therefore, the ECC decoder 139B according to the second embodiment of the present disclosure can provide the effect of reducing the resources required to generate the soft syndrome SD_SYND.

The data determinator 170 may include a syndrome weight comparator 146, a soft data chunk restorer 147, and a hard decision data selector 148.

The syndrome weight comparator 146 may calculate the syndrome weight of the hard syndrome HD_SYND and the soft syndrome SD_SYND. The syndrome weight of the hard syndrome HD_SYND may indicate the error rate of the hard data chunk HD_CK, and the syndrome weight of the soft syndrome SD_SYND may indicate the error rate of the soft data chunk SD_CK. The operation of the syndrome weight comparator 146 to calculate the syndrome weight of the syndrome will be described in detail in FIG. 7.

The syndrome weight comparator 146 compares the syndrome weights of the hard syndrome HD_SYND and the soft syndrome SD_SYND to determine which syndrome has a less syndrome weight. If the syndrome weight of the soft syndrome SD_SYND is less than the syndrome weight of the hard syndrome HD_SYND, the syndrome weight comparator 146 may generate the first control signal CTR1 to enable the soft data chunk restorer 147 to restore the soft data chunk SD_CK.

If the syndrome weight of the soft syndrome SD_SYND is greater than the syndrome weight of the hard syndrome HD_SYND, the syndrome weight comparator 146 may generate the second control signal CTR2 to disable the soft data chunk restorer 147.

In response to the first control signal CTR1 received from the syndrome weight comparator 146, the soft data chunk restorer 147 may perform a fourth logic operation on the hard data chunk HD_CK and the delta bit data Δ_DAT to restore the soft data chunk SD_CK not received from the memory device 150. The fourth logic operation may be the same logic operation as the first logic operation performed by the memory device 150 to generate the delta bit data Δ_DAT, i.e., the fourth logic operation may include an XOR operation.

The soft data chunk restorer 147 may be disabled in response to the second control signal CTR2 received from the syndrome weight comparator 146.

Thus, the ECC decoder 139B according to the second embodiment of the present disclosure may restore the soft data chunk SD_CK not received from the memory device 150 only when the error rate of the soft data chunk SD_CK is less than the error rate of the hard data chunk HD_CK, and may determine the restored soft data chunk SD_CK as the hard decision data HD_DAT. Thus, the ECC decoder 139B according to the second embodiment of the present disclosure may provide an effect of reducing resources wasted in restoring the soft data chunk SD_CK that is not used due to a high error rate.

The hard decision data selector 148 may output one of the hard data chunk HD_CK received from the memory device 150 and the soft data chunk SD_CK restored by the soft data chunk restorer 147 to the error corrector 149 in response to the first and second control signals CTR1, CTR2.

Accordingly, the hard decision data selector 148 may output the restored soft data chunk SD_CK to the error corrector 149 in response to the first control signal CTR1. Further, the hard decision data selector 148 may output the hard data chunk HD_CK to the error corrector 149 in response to the second control signal CTR2.

The error corrector 149 may perform an ECC decoding operation using either of the hard data chunk HD_CK and the soft data chunk SD_CK determined by the data determinator 170 as the hard decision data HD_DAT. The error corrector 149 may perform an ECC decoding operation on the delta bit data Δ_DAT received from the memory device 150 as the soft decision data SD_DAT.

FIGS. 5A through 5C are a block diagram illustrating a hard decision read operation and a soft decision read operation according to an embodiment of the present disclosure. FIGS. 5A to 5C illustrate the threshold voltage distributions formed by the memory cells, and in each graph, the horizontal axis may refer to the threshold voltage and the vertical axis may refer to the number of memory cells.

Referring to FIG. 5A, the memory cells may form the threshold voltage distributions VTH1, VTH2 such that each of the memory cells has a constant threshold voltage according to the data stored therein. For example, the memory cells in which data '1' is stored may form the threshold voltage distribution VTH1, and the memory cells in which data '0' is stored may form the threshold voltage distribution VTH2.

When the hard decision read operation is performed, the data stored in the memory cells may be read from the memory cells by determining the threshold voltage of the memory cells by the hard decision read voltage V_HD. Specifically, when the hard decision read voltage V_HD is supplied to the word line corresponding to the memory cells, data '1' may be read from the memory cells having a threshold voltage less than the hard decision read voltage V_HD and data '0' may be read from the memory cells having the threshold voltage higher than the hard decision read voltage V_HD. Therefore, when the hard decision read operation is performed, the threshold voltage distributions must be separated from each other by the hard decision read voltage V_HD, so that the memory device 150 may perform the write operation so that the gap between the threshold voltage distributions VTH1, VTH2, that is, the read margin, is sufficiently secured.

Referring to FIG. 5B, the threshold voltage distributions VTH1, VTH2 may have a deformed shape or shift along the horizontal axis due to various causes, e.g., discharge of already charged charges, interference, or disturbance between adjacent memory cells, etc. For example, the threshold voltage distribution VTH2 may shift to the threshold voltage distribution VTH3. As a result, some of the threshold voltage distributions VTH1, VTH3 may overlap. When some of the threshold voltage distributions VTH1, VTH3 overlap, if the read operation is performed using the hard decision read voltage V_HD already set, the data stored in the memory cells may read to a value different from the value originally stored, i.e., the read data may include the error. Even if the read data includes the error, the shift in the threshold voltage distribution may not be a concern if the controller 130 successfully performs the ECC decoding operation. The ECC decoding operation may be more likely to succeed if the read data includes fewer errors, and the ECC decoding operation may be more likely to fail when the read data includes more errors.

Referring to FIG. 5C, by changing the hard decision read voltage V_HD to the soft decision read voltage V_SD for the shifted threshold voltage distributions VTH1, VTH3, the errors included in the read data may be minimized. Specifically, data '0' is actually stored, but data '1' may be erroneously read by using the hard decision read voltage V_HD. In FIG. 5C, the memory cells from which data is incorrectly read may be indicated by dashed lines. That is, the memory cells within the dashed lines may have the error when the hard decision read voltage V_HD is used. In addition, the memory cells where data '1' is actually stored, but data '0' may be erroneously read by using the changed soft decision read voltage V_SD and the memory cells where data '0' is actually stored, but data '1' is erroneously read by using the changed soft decision read voltage V_SD may be shaded. That is, the shaded memory cells may have the error when the changed soft decision read voltage V_SD is used.

That is, when the threshold voltage corresponding to the target formed by the threshold voltage distributions VTH1, VTH3 is changed to the new soft decision read voltage V_SD, the errors included in the read data can be minimized. And, since an ECC decoding operation is more likely to be successful when there are fewer errors in the read data, the ECC decoding operation on the read data can be more likely to be successful by using the changed soft decision read voltage V_SD.

The controller 130 may perform the hard decision read voltage change operation when the controller 130 determines that the hard decision read voltage used by the memory device 150 to determine the threshold voltage of the memory cells needs to be newly changed. For example, the controller 130 may determine, when an ECC decoding operation has failed, that it is necessary to perform the hard decision read voltage change operation for a specific region where the ECC decoding operation has failed. The ECC decoding operation failure may occur when the read data from a specific region includes too many errors due to a shift in the threshold voltage distribution. Further, the controller 130 may determine that a new hard decision read voltage is required instead of the original hard decision read voltage for a specific region, on which the ECC decoding operation fails.

Hereinafter, the original hard decision read voltage is referred to as the first hard decision read voltage and the new hard decision read voltage is referred to as the second hard decision read voltage.

The second hard decision read voltage newly changed by the hard decision read voltage change operation may be closer to the threshold voltage corresponding to the target formed by the threshold voltage distribution than the original first hard decision read voltage. Since it is difficult to accurately locate the target formed by the threshold voltage distributions, the controller 130 may change the hard decision read voltage to be closer to the threshold voltage corresponding to the target than the first hard decision read voltage by the hard decision read voltage change operation. The hard decision read voltage change operation may be performed repeatedly, and each time the hard decision read voltage change operation is performed repeatedly, the newly changed (n)th hard decision read voltage may be closer to the threshold voltage corresponding to the target than the previously changed (n−1)th hard decision read voltage, thereby further increasing the probability of a successful ECC decoding operation.

Specifically, when the operation of changing the hard decision read voltage is performed, the controller 130 may set a plurality of soft decision read voltages based on the hard decision read voltage and the offset value. When the hard decision read voltage change operation for a specific region is first initiated, the first hard decision read voltage and the first offset value may be preset values based on the characteristics of the memory device 150.

Figure 6:
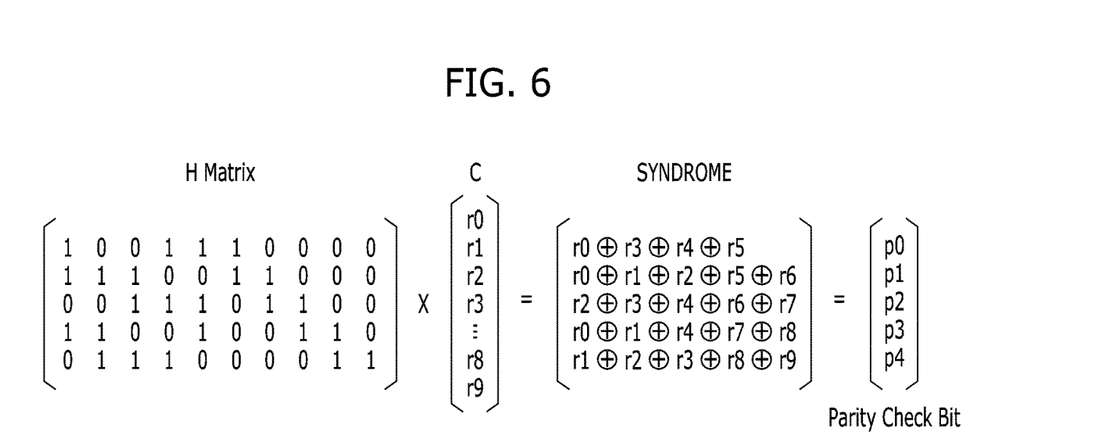
FIG. 6 is a block diagram describing a syndrome calculation operation according to an embodiment of the present disclosure.

FIG. 6 is a block diagram describing a syndrome calculation operation according to an embodiment of the present disclosure.

FIG. 6 illustrates an example of a parity check matrix (H matrix). Referring to FIG. 6, the controller 130 may determine whether the data chunk includes the error based on the parity check matrix (H Matrix) corresponding to the LDPC code.

First, the controller 130 may perform a multiplication of the parity check matrix H Matrix and the data chunk matrix C comprising the data chunk, to calculate the syndrome SYND. For example, the parity check bits of the syndrome SYND may be generated by a binary sum, such as a modulo-2 sum, of the bits r0 to r9 in the data chunk.

FIG. 7 is a block diagram describing a syndrome weight calculation operation according to an embodiment of the present disclosure.

The controller 130 may use the syndrome SYND to calculate the syndrome weight PSUM. The syndrome weight PSUM may be the number of '1's included in the syndrome SYND. The syndrome weight PSUM is the sum of the parity check bits (p0~p4) of the syndrome SYND and may be expressed as a parity check sum PSUM. And the syndrome weight may be proportional to the error rate of the data chunk.

The controller 130 may determine that the data chunk does not include the error if the syndrome weight PSUM is '0', and may determine that the data chunk includes the error if the syndrome weight PSUM is not '0'.

On the other hand, the smaller the syndrome weight PSUM of the data chunk, the greater the likelihood that the data chunk includes fewer errors. The smaller the syndrome weight PSUM of the data chunk, the greater the probability of a successful ECC decoding operation on the data chunk.

Figure 8A:
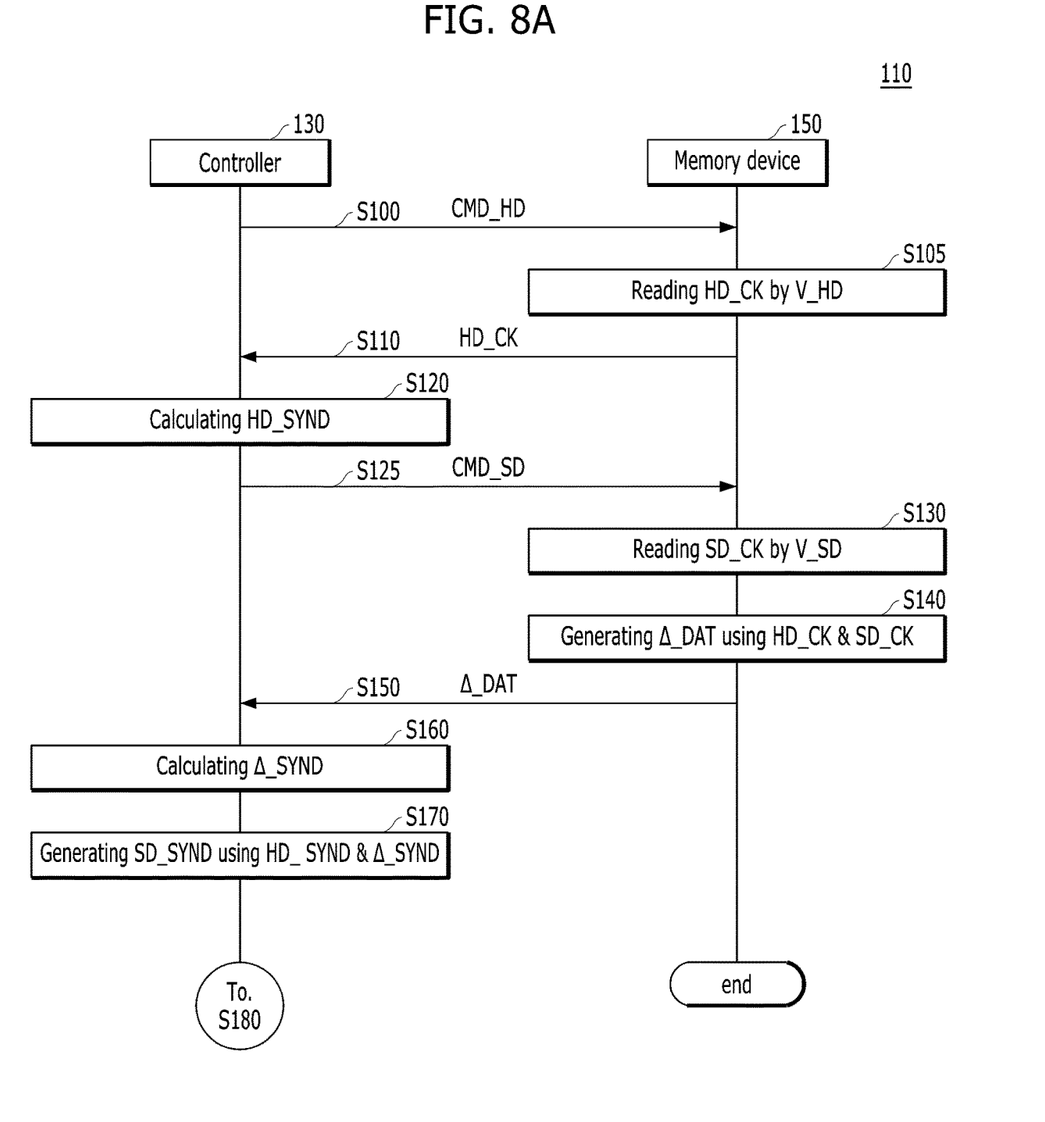
FIGS. 8A and 8B are diagrams for describing a method of performing an ECC decoding operation according to a second embodiment of the present disclosure.
Figure 8B:
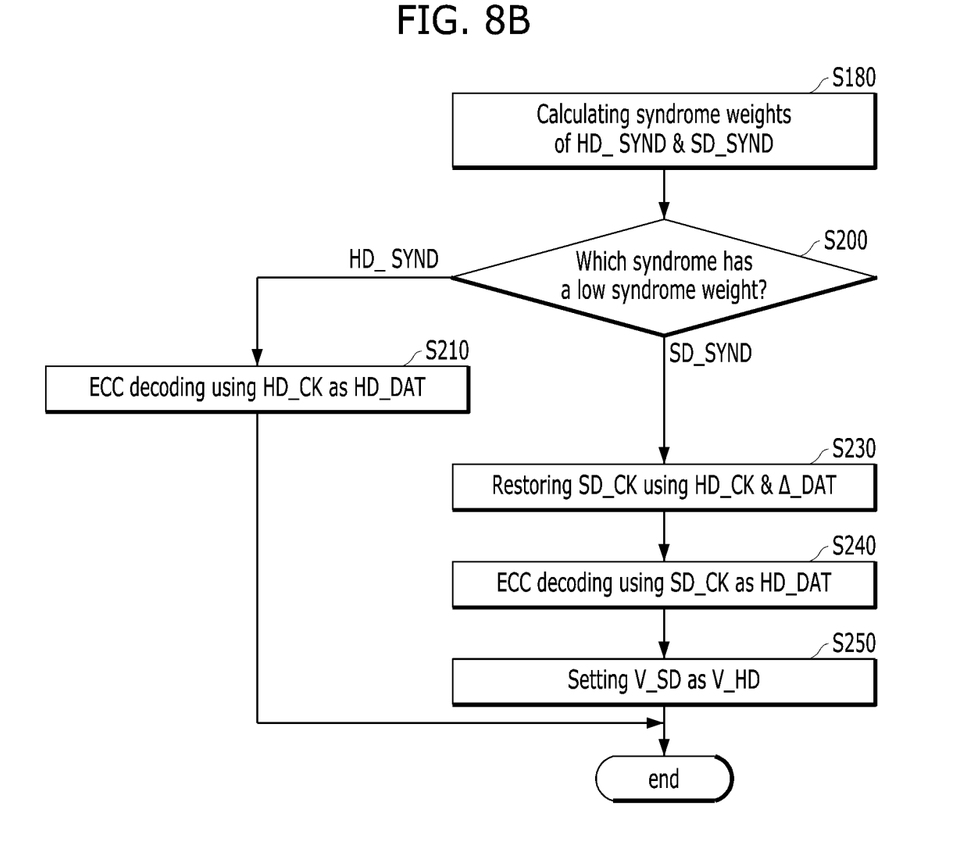

FIGS. 8A and 8B are diagrams describing a method of performing an ECC decoding operation according to a second embodiment of the present disclosure. In particular, FIG. 8A is a sequence diagram illustrating a method for generating soft syndrome SD_SYND according to a second embodiment of the present disclosure. FIG. 8B is a flowchart illustrating a method of performing the ECC decoding operation using the hard syndrome HD_SYND and the soft syndrome SD_SYND generated in FIG. 8A.

Hereinafter, referring to FIGS. 1, 4, and 8A, the operation of the memory system 110 to generate the hard syndrome HD_SYND, the delta syndrome Δ_SYND, and the soft syndrome SD_SYND is described.

In operation S100, the controller 130 may transmit a hard decision read command CMD_HD to the memory device 150 to receive the hard data chunk HD_CK from the memory device 150.

In operation S105, when the hard decision read command CMD_HD is received, the memory device 150 may perform the hard decision read operation. The hard decision read operation may be performed to read the hard data chunk HD_CK in a specific region of the memory device 150, using the hard decision read voltage V_HD. The memory device 150 may store the hard data chunk HD_CK in the page buffer 152. In operation S110, the memory device 150 may transmit the hard data chunk HD_CK stored in the page buffer 152 to the controller 130.

In operation S120, when the hard data chunk HD_CK is received from the memory device 150, the controller 130 may calculate the hard syndrome HD_SYND for the hard data chunk HD_CK.

In operation S125, to receive the soft decision data SD_DAT from the memory device 150, the controller 130 may transmit the soft decision read command CMD_SD to the memory device 150.

In operation S130, when the soft decision read command CMD_SD is received, the memory device 150 may perform the soft decision read operation. The soft decision read operation may be performed to read the soft data chunk SD_CK in the specific region of the memory device 150 using the soft decision read voltage V_SD. The memory device 150 may store the read soft data chunk SD_CK in the page buffer 152.

The soft data chunk SD_CK is read from the same region as the hard data chunk HD_CK by the soft decision read voltage V_SD which differs from the hard decision read voltage V_HD by the preset offset. The soft data chunk SD_CK is the read data for verifying the reliability of the hard data chunk HD_CK and may have the same data size as the hard data chunk HD_CK.

In operation S140, the memory device 150 may perform the logic operation on the hard data chunk HD_CK and the soft data chunk SD_CK to generate the delta bit data Δ_DAT. At this time, the generated delta bit data Δ_DAT may be stored in the page buffer 152.

In operation S150, the memory device 150 may transmit the delta bit data Δ_DAT to the controller 130.

In operation S160, the controller 130 may calculate the delta syndrome Δ_SYND, which is the syndrome for the delta bit data Δ_DAT received from the memory device 150. When the compressed delta bit data Δ_DAT is received from the memory device 150, the controller 130 may further perform a decompression operation on the received delta bit data Δ_DAT.

In operation S170, the controller 130 may perform the logic operation on the calculated hard syndrome HD_SYND and the delta syndrome Δ_SYND to generate the soft syndrome SD_SYND. The soft syndrome SD_SYND may be the syndrome for the soft data chunk SD_CK. In this case, if the delta bit data Δ_DAT was generated by the XOR operation of the hard data chunk HD_CK and the soft data chunk SD_CK in operation S140, the controller 130 may generate the soft syndrome SD_SYND by the XOR operation of the hard syndrome HD_SYND and the delta syndrome Δ_SYND in operation S170.

In the description of FIG. 8A, the operation of S120 is described as performed between the operation S110 and the operation S125, but the present disclosure may also include embodiments in which the operation S120 is performed between the operation S110 and the operation S170.

Thus, the memory system 110 of the present disclosure does not restore the soft data chunk SD_CK and therefore does not use the soft data chunk SD_CK to calculate the soft syndrome SD_SYND. The memory system 110 of the present disclosure may generate the soft syndrome SD_SYND by performing the logic operation on the hard syndrome HD_SYND and the delta syndrome Δ_SYND.

Referring to FIG. 8B, in operation S180, the controller 130 may calculate the syndrome weight of the hard syndrome HD_SYND already calculated in operation S120 of FIG. 8. The controller 130 may calculate the syndrome weight of the soft syndrome SD_SYND already calculated in operation S170 of FIG. 8.

In operation S200, the controller 130 may determine the syndrome having the less syndrome weight, among the soft syndrome SD_SYND and the hard syndrome HD_SYND.

If the syndrome having the less syndrome weight is the soft syndrome SD_SYND, as a result of the judgment of the operation S200, the controller 130 in operation S230 may restore the soft data chunk SD_CK by performing the logic operation on the hard data chunk HD_CK and the delta bit data Δ_DAT. Since the delta bit data Δ_DAT was generated by the XOR operation of the hard data chunk HD_CK and the soft data chunk SD_CK, the soft data chunk SD_CK may be restored by the XOR operation of the hard data chunk HD_CK and the delta bit data Δ_DAT.

In operation S240, the controller 130 may use the restored soft data chunk SD_CK as the hard decision data HD_DAT to perform an ECC decoding operation. At this time, the delta bit data Δ_DAT may be used as the soft decision data SD_DAT to perform the ECC decoding operation. Furthermore, an embodiment of the present disclosure may include an embodiment in which the delta bit data Δ_DAT is used as the soft decision data SD_DAT to perform the ECC decoding operation when the ECC decoding operation failed in operation S240.

In operation S250, the controller 130 may set the soft decision read voltage V_SD to the hard decision read voltage V_HD which is performed in the next hard read operation.

If the syndrome having the less syndrome weight is the hard syndrome HD_SYND, as a result of the judgment of the operation S200, the controller 130 in operation S210 may perform the ECC decoding operation on the hard data chunk HD_CK as the hard decision data HD_DAT.

The controller 130 may also set the hard decision read voltage V_HD used in the hard read operation (S105 of FIG. 8A) to the hard decision read voltage V_HD of the next hard read operation to be performed.

Thus, the memory system 110 of the present disclosure may calculate the syndrome weight of the soft syndrome SD_SYND without restoring the soft data chunk SD_CK. Accordingly, the memory system 110 of the present disclosure may provide an effect of reducing the resources needed by the controller 130 and the ECC decoding time required to restore the soft data chunk SD_CK.

In addition, the memory system 110 of the present disclosure may restore the soft data chunk SD_CK only if the syndrome weight of the soft syndrome SD_SYND is less than the syndrome weight of the hard syndrome HD_SYND. Therefore, the present disclosure can provide the effect of reducing the resources required for unnecessary restoration of the soft data chunk SD_CK.

Further, the memory system 110 of the present disclosure can select the data chunk corresponding to the syndrome having the lowest syndrome weight as the hard decision data HD_DAT among the hard syndrome HD_SYND and the soft syndrome SD_SYND. Thus, the present disclosure can provide an effect of improving the reliability of data by increasing the probability of success of the ECC decoding operation.

Further, the present disclosure may set the read voltage used to read the data chunk with higher reliability to the read voltage of the hard decision read operation to be performed next. Thus, the present disclosure can provide the effect of improving the reliability of the data by increasing the probability of success of the next ECC decoding operation.

In the above description of the present disclosure, only an embodiment of performing the soft read operation once after performing the hard decision read operation has been described, but the present disclosure may include an embodiment of performing the soft read operation multiple times.

The memory system 110 of the present disclosure may generate a plurality of delta syndromes Δ_SYND1 to Δ_SYNDn by performing the logic operation on each of the hard data chunk HD_CK and the plurality of delta bit data Δ_DAT1 to Δ_DATn received from the memory device 150. Then, the memory system 110 may perform the ECC decoding operation on the data chunk for the syndrome having the lowest syndrome weight as the hard decision data HD_DAT. This may further increase the probability of success of the ECC decoding operation.

One of ordinary skill in the art to which this invention belongs will recognize that the invention may be practiced in other specific forms without altering its technical ideas or essential features, and therefore the embodiments described above should be understood to be examples and non-limiting in all respects. The scope of the present disclosure is indicated by the following claims rather than by the detailed description above, and the meaning and scope of the claims and all modifications or variations derived from their equivalents are to be construed as being within the scope of the present disclosure.

Although the detailed embodiments have been described in the detailed description of the present disclosure, the present disclosure may be modified in several ways without departing from the scope of the present disclosure. Accordingly, the scope of the present disclosure should not be limited to the aforementioned embodiments, but should be defined by not only the claims, but equivalents thereof.

The embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. Furthermore, the embodiments may be combined to form additional embodiments.

What is claimed is:

1. A controller for controlling a memory device comprising:
   a hard syndrome calculator configured to generate a hard syndrome by performing a syndrome operation on a hard data chunk received from the memory device;
   a delta syndrome calculator configured to generate a delta syndrome by performing a syndrome operation on a delta bit data received from the memory device, the delta bit data indicating a reliability of the hard data chunk;
   a soft syndrome generator configured to generate a soft syndrome by performing a logic operation on the hard syndrome and the delta syndrome;
   a data determinator configured to select, as hard decision data, one of the hard data chunk and a soft data chunk, the selected data chunk corresponding to a syndrome having a lowest syndrome weight among the hard syndrome and the soft syndrome; and
   an error corrector configured to perform an ECC decoding operation on the hard decision data.

2. The controller of claim 1, wherein the data determinator includes a soft data chunk restorer configured to restore the soft data chunk corresponding to the soft syndrome when the soft syndrome has a less syndrome weight than the hard syndrome.

3. The controller of claim 2, wherein the soft data chunk restorer restores the soft data chunk by performing a logic operation on the hard data chunk and the delta bit data.

4. The controller of claim 2, wherein the data determinator selects the soft data chunk as the hard decision data when the soft syndrome has the less syndrome weight than the hard syndrome.

5. The controller of claim 1, wherein the data determinator selects the hard data chunk as the hard decision data when the soft syndrome has a greater syndrome weight than the hard syndrome.

6. The controller of claim 2, wherein the hard data chunk is decided from a specific region within a memory cell array of the memory device by a preset hard decision read voltage.

7. The controller of claim 6, wherein the delta bit data is generated by the logic operation of the memory device on the hard data chunk and the soft data chunk read from the specific region by a soft decision read voltage having a different value by a preset offset from the hard decision read voltage.

8. The controller of claim 7, wherein the soft syndrome is a syndrome of the soft data chunk.

9. The controller of claim 7, wherein the delta bit data indicates whether each bit included in the hard data chunk is identical to a corresponding bit included in the soft data chunk.

10. The controller of claim 7, wherein the delta bit data includes location information of a bit within the hard data chunk, which is different from a corresponding bit included in the soft data chunk.

11. The controller of claim 7, wherein the controller controls, when the soft syndrome has the less syndrome weight than the hard syndrome, the memory device such that the soft decision read voltage is set to the hard decision read voltage for a subsequent hard data chunk to be provided from the memory device.

12. The controller of claim 1, wherein the logic operation is an exclusive OR operation.

13. A memory system comprising:
    a controller; and
    a memory device including a memory cell array and configured to
       generate a delta bit data by performing a logic operation on a hard data chunk and a soft data chunk, the hard data chunk being read by a hard decision read voltage from a specific region of the memory cell array, the soft data chunk being read by a soft decision read voltage from the specific region, the soft decision read voltage being different from the hard decision read voltage by a preset offset, and
       provide the controller with the hard data chunk and the delta bit data other than the soft decision read voltage; and
    wherein the controller includes:
    a soft syndrome generator configured to generate a soft syndrome by performing a logic operation on a hard syndrome for the hard data chunk and a delta syndrome for the delta bit data; and
    a data determiner configured to determine whether to restore the soft data chunk based on a result of comparing a syndrome weight of the hard syndrome with a syndrome weight of the soft syndrome.

14. The memory system of claim 13, wherein the data determinator restores the soft data chunk when the soft syndrome has a less syndrome weight than the hard syndrome.

15. The memory system of claim 14, wherein the data determinator restores the soft data chunk by performing the logic operation on the hard data chunk and the delta bit data.

16. The memory system of claim 14, wherein the controller further comprises an error corrector configured to perform an ECC decoding operation on the restored soft data chunk as the hard decision data.

17. The memory system of claim 13, wherein the controller controls, when the soft syndrome has a less syndrome weight than the hard syndrome, the memory device such that the soft decision read voltage is set to the hard decision read voltage for a subsequent hard data chunk to be provided from the memory device.

18. The memory system of claim 13, wherein the data determinator does not restore the soft data chunk when the syndrome weight of the soft syndrome is greater than the syndrome weight of the hard syndrome.

19. The memory system of claim 13, wherein the controller further comprises an error corrector configured to perform, when the soft syndrome has a greater syndrome weight than the hard syndrome, an ECC decoding operation on the hard data chunk as the hard decision data.

20. The memory system of claim 13, wherein the delta bit data indicates whether each bit included in the hard data chunk is identical to a corresponding bit included in the soft data chunk.

21. The memory system of claim 13, wherein the delta bit data includes location information of a bit within the hard data chunk, which is different from a corresponding bit included in the soft data chunk.

22. The memory system of claim 13, wherein the logic operation is an exclusive OR operation.

* * * * *